United States Patent
Liew et al.

(10) Patent No.: US 6,825,554 B2
(45) Date of Patent: Nov. 30, 2004

(54) PBGA ELECTRICAL NOISE ISOLATION OF SIGNAL TRACES

(75) Inventors: Wee K. Liew, San Jose, CA (US); Aritharan Thurairajaratnam, Fremont, CA (US); Nadeem Haque, San Jose, CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 10/387,261

(22) Filed: Mar. 11, 2003

(65) Prior Publication Data

US 2003/0230428 A1 Dec. 18, 2003

Related U.S. Application Data

(62) Division of application No. 09/919,284, filed on Jul. 31, 2001, now Pat. No. 6,566,167.

(51) Int. Cl.[7] .............................................. H01L 23/04
(52) U.S. Cl. ....................... 257/698; 257/778; 257/781; 438/107; 438/108
(58) Field of Search ................................. 257/778, 781, 257/690, 698; 438/107–108

(56) References Cited

U.S. PATENT DOCUMENTS

| | | | |
|---|---|---|---|
| 5,686,764 A | * | 11/1997 | Fulcher ...................... 257/778 |
| 6,133,805 A | | 10/2000 | Jain et al. ...................... 333/1 |
| 6,287,132 B1 | * | 9/2001 | Perino et al. ............... 439/108 |

* cited by examiner

*Primary Examiner*—Hsien-Ming Lee
(74) *Attorney, Agent, or Firm*—Sawyer Law Group LLP

(57) ABSTRACT

A method for fabricating a semiconductor package having a 2-layer substrate, which includes an array of solder balls, is disclosed. The method includes patterning signal traces on a top layer of the substrate and identifying groups of signal traces to isolate. According to the present invention, a grounded isolation trace is then patterned adjacent to one of the groups of traces to isolate the signal traces, thereby providing noise shielding. In a preferred embodiment, the grounded isolation trace is provided with multiple vias, rather than only one. In a further aspect of the present invention a row of solder balls is connected together and to ground to create a bottom-layer isolating ground trace to further reduce noise. The bottom-layer isolating ground trace may be connected to the top-layer isolating ground trace using a via.

5 Claims, 4 Drawing Sheets

PBGA ELECTRICAL NOISE ISOLATION OF SIGNAL TRACES

This application is a divisional of Ser. No. 09/919,284 of Jul. 31, 2001 now U.S. Pat. No. 6,566,167.

FIELD OF THE INVENTION

The present invention relates to ball grid array type semiconductor packages, and more particularly to the design of a trace layout to isolate electrical noise between two adjacent sets of signals in a 2-layer PBGA substrate.

BACKGROUND OF THE INVENTION

Integrated circuits are typically packaged before they are used with other components as part of a larger electronic system. Ball grid array (BGA) packages are constructed with die mounted on a substrate with bond pads on the die connected to conductive lines or traces on the surface substrate. An array of solder balls mounted on the bottom of the substrate are used to attach the package to a PC board or motherboard, as opposed to molded plastic packages that use lead frames on the outer edges of the package substrate to attach the package to the PC board.

A plastic ball grid array (PBGA) is a wire bond package having a 2-layer organic substrate and solder balls. FIG. 1A is a cross sectional view showing the layer stack-up of a typical 2-layer BGA substrate. The package 10 includes a substrate 12, and a die 14 coupled to signal traces 16 on the top surface of the substrate via wire bonds 22. The substrate 12 typically comprises Bismaleimidie Trizine (BT) or the like. Signal traces 16 on the top layer of the substrate 12 are connected on the bottom of the substrate 12 through vias 18. An array of solder balls 20 are mounted on the bottom of the substrate 12 as well.

Although 2-layer PBGA substrates 12 offer a low cost packaging solution, 2-layer PBGA substrates 12 suffer from electrical noise between adjacent sets of signals and coupling interference.

In order to minimize the electrical noise and the coupling interference, the normal option is to use a more costly enhanced plastic ball grid array (EPBGA). An EPBGA is a wire bond package that uses 4-layer organic substrate for better electrical and thermal performance.

FIG. 1B is a cross sectional view showing the layer stack-up of a typical 4-layer substrate. The substrate 52 comprises a top signal layer 54, ground plane (Vss) layer 56, a power plane (Vdd) layer 58, and a bottom signal layer 60. Signal traces are typically patterned on both the top and bottom signal layers 54 and 60, which are connected to the solder bumps 62 through vias 64. The thicker substrate 52 and the two extra planes 56 and 58 between the top and bottom layers 54 and 60 help reduce noise. However, a 4-layer EPBGA cost 20–30% more than a 2-layer PBGA of a similar design.

Accordingly, what is needed a method for fabricating a semiconductor package to reduce electrical noise between adjacent signals in a 2-layer PBGA without adding additional layers. The present invention addresses such a need.

SUMMARY OF THE INVENTION

The present invention provides a method for fabricating a semiconductor package to reduce electrical noise. The semiconductor package uses a 2-layer substrate that includes an array of solder balls on the bottom. The method includes patterning signal traces on a top layer of the substrate and identifying groups of signal traces to isolate. According to the present invention, a grounded isolation trace is then patterned adjacent to one of the groups of traces to isolate the signal traces, thereby providing noise shielding. In a preferred embodiment, the grounded isolation trace is provided with multiple vias, rather than only one. In a further aspect of the present invention a row of solder balls is connected together and to ground to create a bottom-layer isolating ground trace to further reduce noise. The bottom-layer isolating ground trace may be connected to the top-layer isolating ground trace using a via.

According to the system and method disclosed herein, the present invention effectively isolates noise between adjacent signals without adding additional layers and at low cost.

DETAILED DESCRIPTION

The present invention relates to reducing electrical noise in a 2-layer PBGA substrate. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown but is to be accorded the widest scope consistent with the principles and features described herein.

Figure 2:
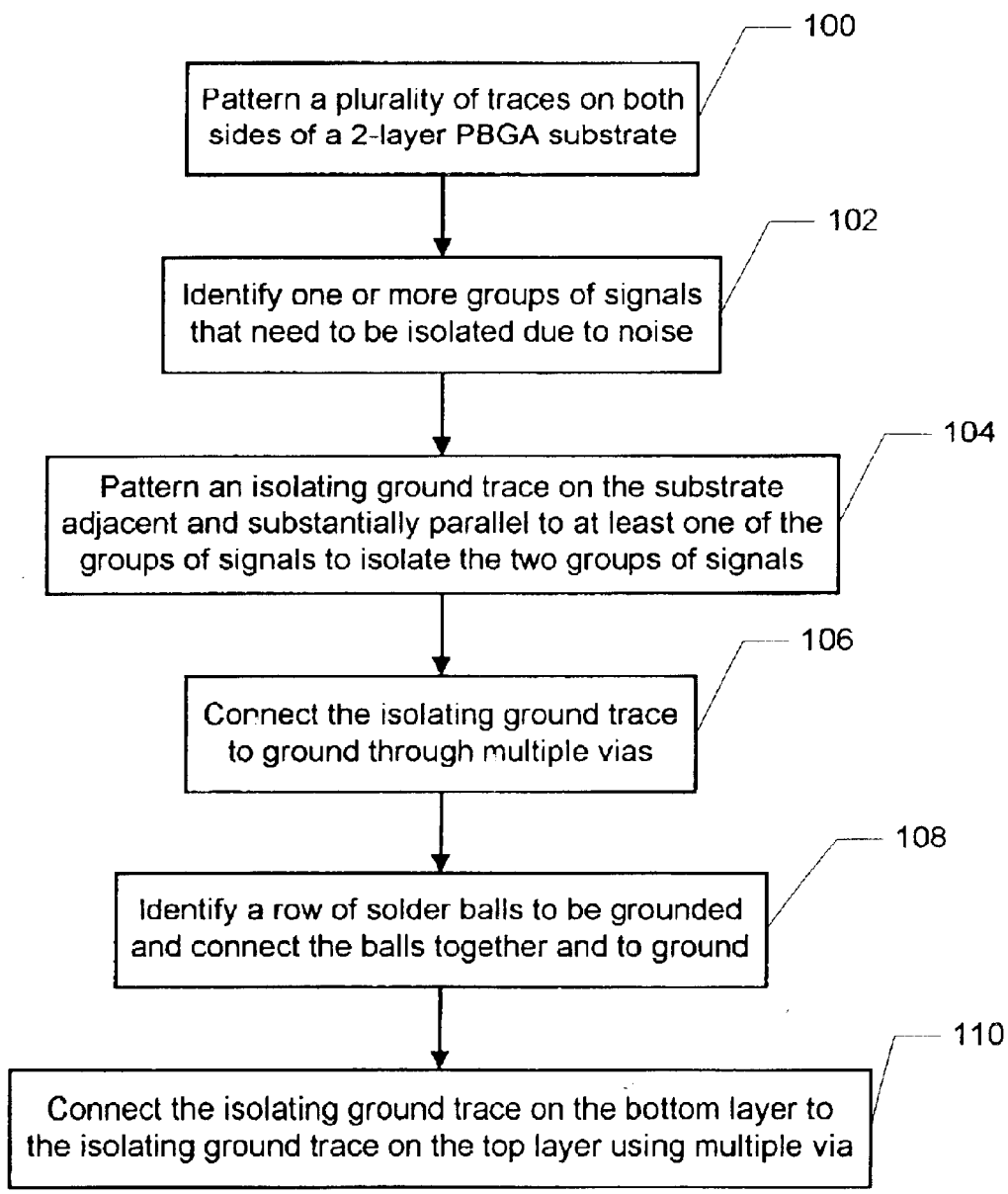
FIG. 2 is a flow chart illustrating the method for fabricating a semiconductor package in accordance with a preferred embodiment of the present invention.

The present invention provides an improved semiconductor package that reduces electrical noise in 2-layer PBGA packages. FIG. 2 is a flow chart illustrating the method for fabricating a semiconductor package in accordance with a preferred embodiment of the present invention. The process begins by patterning a plurality of traces 16 on one or both sides of a 2-layer PBGA organic substrate 12, which includes solder balls 20 on the bottom layer in step 100. One or more groups of signals 16 that need to be isolated due to noise are identified in step 102.

In accordance with the present invention an isolating ground trace is patterned on the substrate adjacent and substantially parallel to at least one of the groups of signals 16 to isolate the two groups of signals 16 in step 104.

Figure 1A:
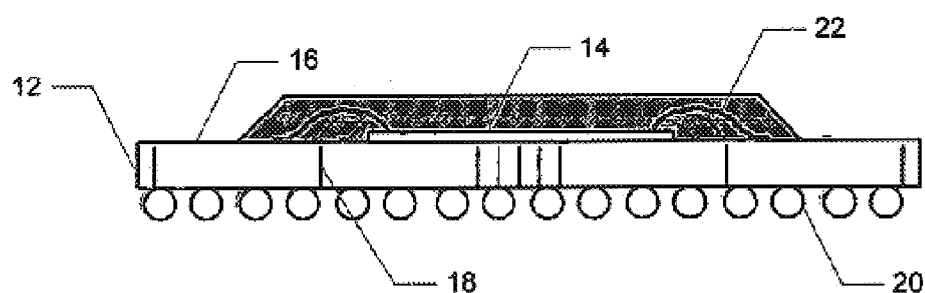
FIG. 1A is a cross sectional view showing a layer stack-up of a conventional 2-layer PBGA substrate.
Figure 1B:
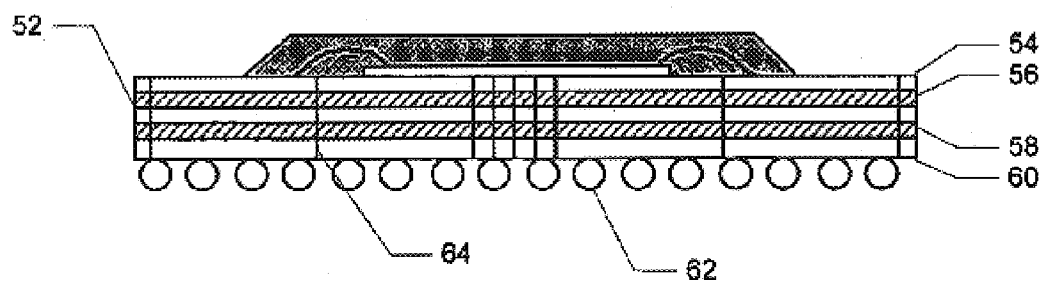
FIG. 1B is a cross sectional view showing a layer stack-up of a typical 4-layer substrate.
Figure 3:
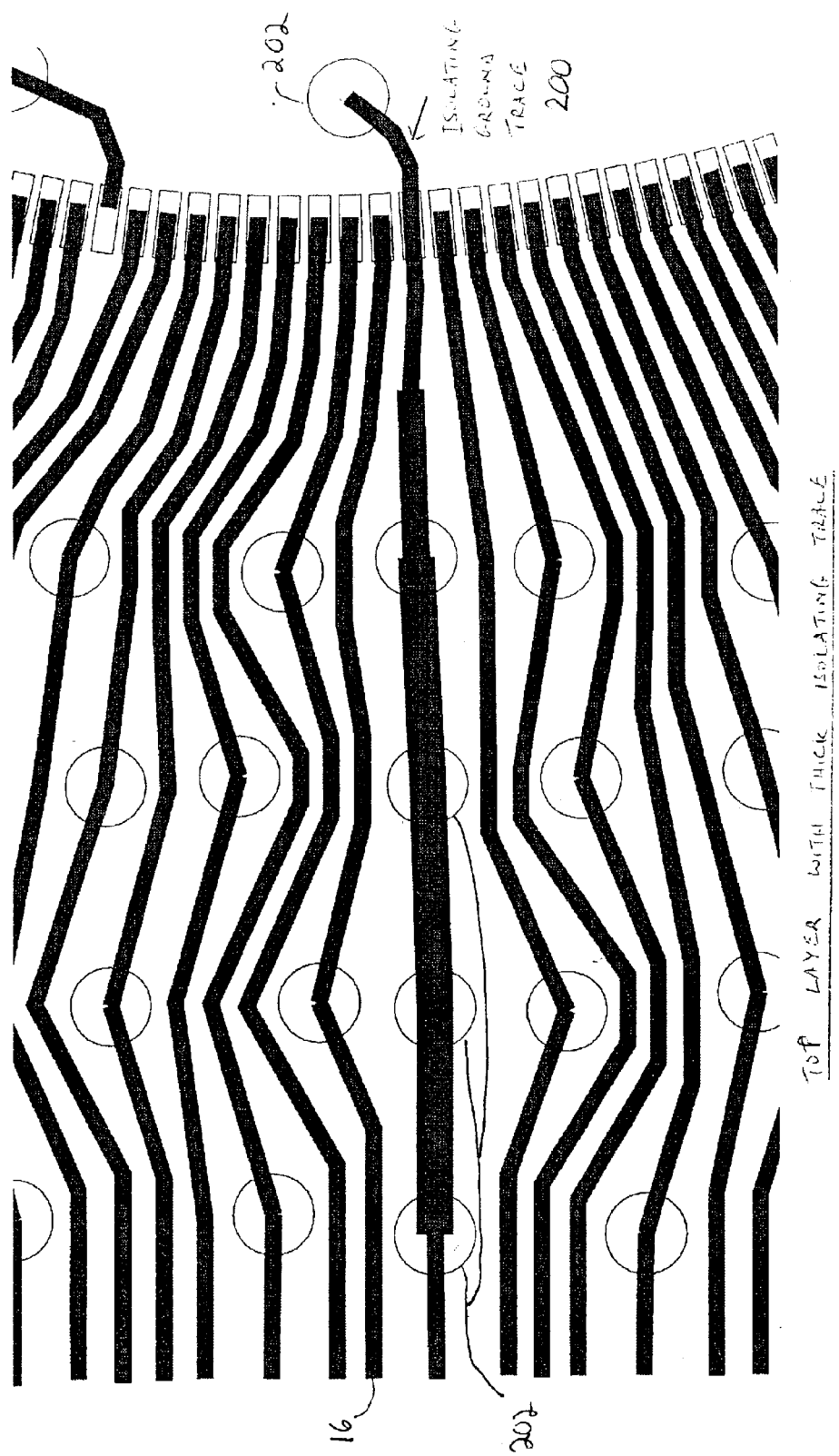
FIG. 3 is a diagram of the top view of a customized 2-layer PBGA substrate showing a portion of the top signal layer in accordance with the present invention.

FIG. 3 is a diagram of the top view of a customized 2-layer PBGA substrate showing a portion of the top signal layer, where like reference numerals from FIG. 1A denotes like components. According to the present invention, at least one isolating ground trace 200 is located between two groups of signal traces on the substrate 12. In a preferred embodiment, the isolating ground trace 200 is thicker than the signal traces 16.

Referring to both FIGS. 2 and 3, the isolating ground trace 200 is connected to ground through multiple vias 202 in step 106. In a preferred embodiment, grounding of the isolating trace 200 is achieved by placing a via 202 on both ends of the isolation trace 200. For lengthy grounded isolation traces 200, multiple vias 202 may be placed along the length of the grounded isolation trace 200 to add further shielding. According to the present invention, the grounded isolating trace 200 in effect acts as a local shield between the signals, thereby protecting the signals from cross talk and achieving noise reduction without adding additional planes to the substrate.

Referring again to FIG. 2, in a further aspect of the present invention, additional noise shielding is provided by identifying a row of solder balls 20 to be grounded and connecting the balls 20 together and to ground in step 108.

Figure 4:
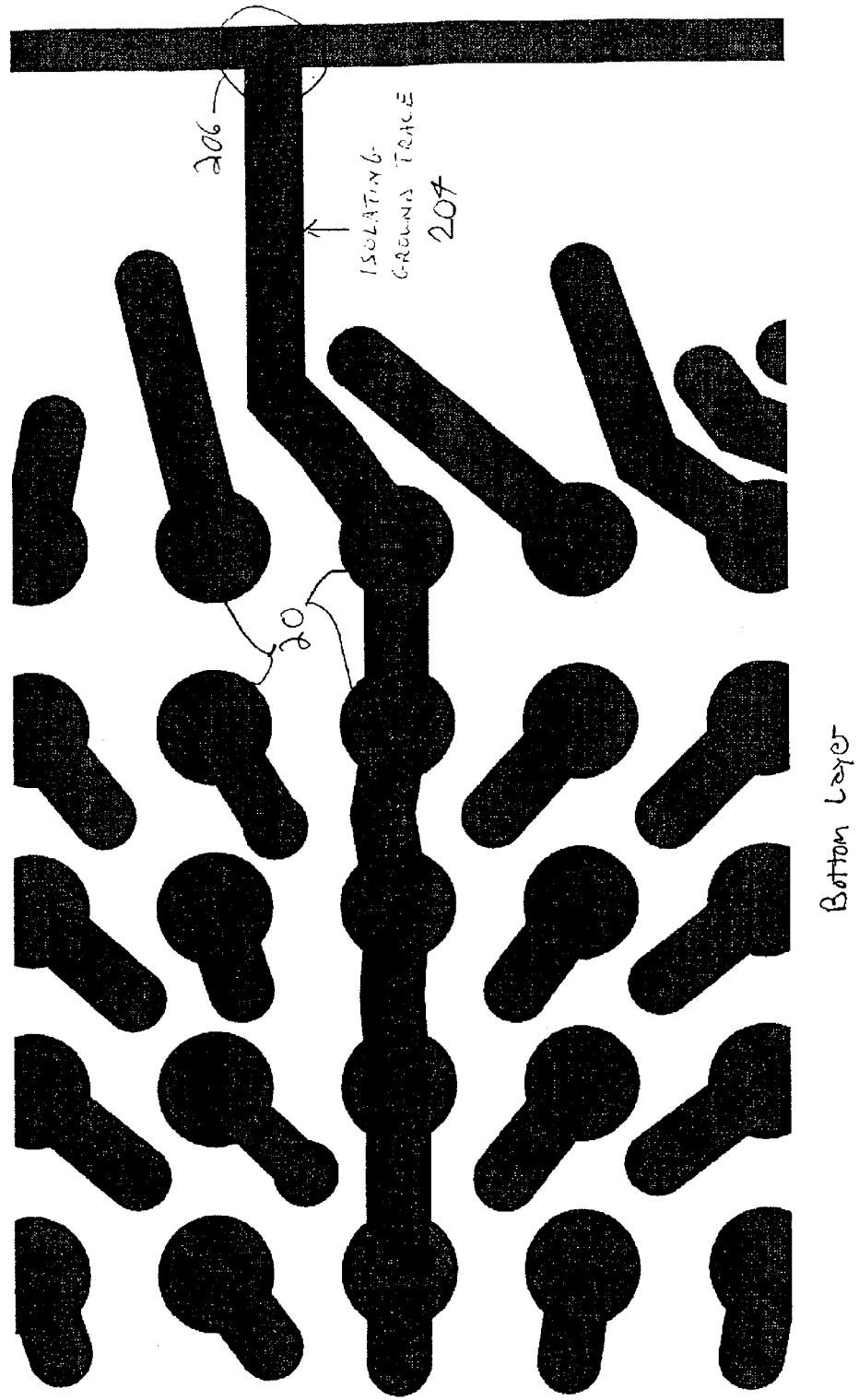
FIG. 4 is a diagram of the bottom view of the customized 2-layer PBGA substrate showing a portion of the bottom signal layer.

FIG. 4 is a diagram of the bottom view of the customized 2-layer PBGA substrate showing a portion of the bottom signal layer, where like reference numerals from FIG. 1A denote like components. The bottom of the substrate 12 includes an array of solder balls 20. An isolating ground trace 204 is formed on the bottom layer by connecting a row of the solder balls 20. Since the rows of solder balls 20 are parallel to each other, the bottom-layer isolating ground trace 204 will also be parallel to the other rows of solder balls 20.

Referring to both FIGS. 2 and 4, in one embodiment, the isolating ground trace 204 on the bottom layer may also be connected to the isolating ground trace 200 on the top layer using multiple via 206 in step 110. By placing isolating traces on the top and bottom layers, the present invention isolates signals on both sides of the 2-layer substrate 12 with minimal interference.

Accordingly, the present invention enhances electrical performance of a 2-layer PBGA, while maintaining cost because additional layers in the substrate are unnecessary to control noise. Furthermore, since the wire bond profile is the same as the adjacent signals, the method will provide reduced coupling along the wire bond traverse.

A PBGA semiconductor package having electrical noise Isolation of signal traces has been disclosed. The present invention has been described in accordance with the embodiments shown, and one of ordinary skill in the art will readily recognize that there could be variations to the embodiments, and any variations would be within the spirit and scope of the present invention. For example, although the method for isolating noise present invention has been described in terms of wire-bond packaging, the present invention can be used for other types of packaging where the number of substrate layers need to be kept to a minimum, such as flip-chip, tab, and so on. Accordingly, many modifications may be made by one of ordinary skill in the art without departing from the spirit and scope of the appended claims.

What is claimed is:

1. A package substrate having noise control, comprising:
   at most two layers;
   a plurality of signal traces on a first layer;
   at least one isolating ground trace on the first layer between two signal traces to provide noise shielding; and
   an array of solder balls on a second layer such that at least one row of solder balls is connected together and to around to create a second-layer isolating ground trace.

2. The package of claim 1 wherein the isolating ground trace is connected to a ground.

3. The package of claim 1 wherein the second-layer isolating ground trace is connected to the isolating ground trace on the first layer using a via.

4. The package of claim 3 wherein the isolating ground trace includes multiple vias, with one via located on each end of the isolating ground trace.

5. The package of claim 4 wherein the isolating ground trace is patterned adjacent and substantially parallel to the signal traces on the first layer.

* * * * *

UNITED STATES PATENT AND TRADEMARK OFFICE
CERTIFICATE OF CORRECTION

PATENT NO. : 6,825,554 B2
APPLICATION NO. : 10/387261
DATED : November 30, 2004
INVENTOR(S) : Wee K. Liew, Aritharan Thurairajaratnam and Nadeem Haque It is certified that error appears in the above-identified patent and that said Letters Patent is hereby corrected as shown below:

Column 4, line 25, claim 1 "around" should read --ground--.

Signed and Sealed this

Sixth Day of April, 2010

David J. Kappos
*Director of the United States Patent and Trademark Office*